United States Patent
Savage, Jr.

(10) Patent No.: US 6,666,689 B1
(45) Date of Patent: Dec. 23, 2003

(54) ELECTRICAL CONNECTOR WITH INTERSPERSED ENTRY PORTS FOR PINS OF DIFFERENT LEDS

(76) Inventor: John M. Savage, Jr., 538 B. Via De La Valle, Solana Beach, CA (US) 92075

( * ) Notice: Subject to any disclaimer, the term of this patent is extended or adjusted under 35 U.S.C. 154(b) by 0 days.

(21) Appl. No.: 10/256,922

(22) Filed: Sep. 30, 2002

(51) Int. Cl.[7] .............................................. H01R 12/00
(52) U.S. Cl. ...................... 439/56; 439/683; 439/682; 439/617; 362/555; 362/378
(58) Field of Search ......................... 439/56, 683, 682, 439/617; 362/555, 378

(56) References Cited

U.S. PATENT DOCUMENTS

| | | | |
|---|---|---|---|
| 3,833,877 A | * | 9/1974 | Fujita et al. ................. 439/680 |
| 4,752,246 A | * | 6/1988 | Triner et al. ................. 439/682 |
| 5,176,528 A | * | 1/1993 | Fry et al. ..................... 439/181 |
| 5,261,837 A | * | 11/1993 | Kilsdonk et al. ............ 439/617 |
| 5,496,196 A | * | 3/1996 | Schachtebeck .............. 439/682 |
| 5,732,176 A | | 3/1998 | Savage, Jr. |
| 5,744,213 A | * | 4/1998 | Nelson ........................ 428/131 |
| 6,039,460 A | * | 3/2000 | Ng et al. ..................... 362/267 |

* cited by examiner

*Primary Examiner*—Dean A. Reichard
*Assistant Examiner*—Anton Harris
(74) *Attorney, Agent, or Firm*—William W. Haefliger

(57) ABSTRACT

An electrical connector comprising, in combination a body defining first and second electrical terminal entry ports, the first entry ports including four ports, there being an LED unit having pin terminals respectively received in three of said four ports, three of said pin terminals adapted for delivering controllable electrical current for controlling color emitted by the LED unit, another of said pin terminals received in a fourth one of said four ports.

29 Claims, 10 Drawing Sheets

Fig 17

INSERT LENS INTO PANEL OPENING. INSTALL LOCKING RING ON THE LENS. PRESS CONNECTOR ON.

Fig 18

EXCESSIVE TIGHTENING OF THE CONNECTOR WILL CAUSE THE LOCKING RING TO OVER COMPRESS.

Fig 19

THE RESISTANCE FORCE OF THE LOCKING RING WILL CAUSE THE CONNECTOR RIDE OVER THE LENS THREADS.

Fig 20

THE MATING THREADS WILL NOT STRIP. THE CONNECTOR CAN NOW BE RETIGHTENED TO THE PROPER SECURED POSITION.

ELECTRICAL CONNECTOR WITH INTERSPERSED ENTRY PORTS FOR PINS OF DIFFERENT LEDS

BACKGROUND OF THE INVENTION

This invention relates generally to generating, and transmission of light, as from different LED sources; and more particularly concerns improvements in compact arrangement of entry ports for LED pin terminals, in electrical connectors.

There is need for improvements in apparatus and method to overcome deficiencies and problems with incompatibility of pin terminal entry ports of prior connections.

SUMMARY OF THE INVENTION

It is a major object of the invention to provide improved apparatus and methods as referred to. Basically the invention provides an improved electrical connector that comprises a) a body defining first and second electrical terminal entry ports, b) the first entry ports including a group of four ports, c) there being an LED unit having pin terminals respectively received in three of said four ports, three of such pin terminals adapted for delivering controllable electrical current for controlling color emitted by the LED, d) another of said LED pin terminals received in a fourth one of the ports to provide an electrical common.

As will be seen, and in addition, the second entry ports may include two ports which are spaced closer together than any two of said group of four ports. Those two second entry ports are typically located in interspersed relation with the first entry ports, as for example within an a real zone defined by the first four entry ports.

Another object include provision of female electrical terminals in alignment with the first and second entry ports; and typically four of the female electrical terminals associated with the first four entry ports are adapted to receive the four pin terminals of a selected LED. Likewise, two of the female terminals associated with the second entry ports are adapted to receive two pin terminals of another selected LED, whereby the six ports of the connector are compatible with the pins of either of the two LEDs.

A further object is to provide each female terminal to have a sleeve, a tapered guide surface within said sleeve, and a spring finger having an edge to frictionally engage the surface of an LED unit terminal pin received in the sleeve.

A yet further object is to provide a) a holder in the form of a socket at one end of the holder and a connector at the opposite end of the holder, b) internal threads in the holder to threadably connect to an lens unit, c) the connector having terminal ports, d) and an LED unit having a light transmitting end received into the holder, said unit having pins received into said connector ports, for electrical connection to circuitry that energizes one or more LEDs in said unit.

As will be seen, six of such ports may be provided; and three of such ports may be in one row to define a first plane with another three of the ports in another row to define a second plane, the planes being parallel. Alternatively the ports in each row may be staggered.

Yet another object is to provide an LED to connector coupling method that includes a) selecting one of two LED units, the first characterized as having four pin terminals, and the second characterized as having two pin terminals, b) and inserting the pin terminals of the selected LED unit into one of said connector first entry ports and second entry ports spaced apart, and typically interspersed, to receive said pin terminals.

That method may typically also include providing electrical female terminals in alignment with said entry ports to receive insertion of said related pin terminals.

Further a hollow lens may be provided in alignment with the LED unit, and to internally receive the LED unit within a cavity in the hollow lens, for extreme compactness.

These and other objects and advantages of the invention, as well as the details of an illustrative embodiment, will be more fully understood from the following specification and drawings, in which:

DETAILED DESCRIPTION

Figure 1:
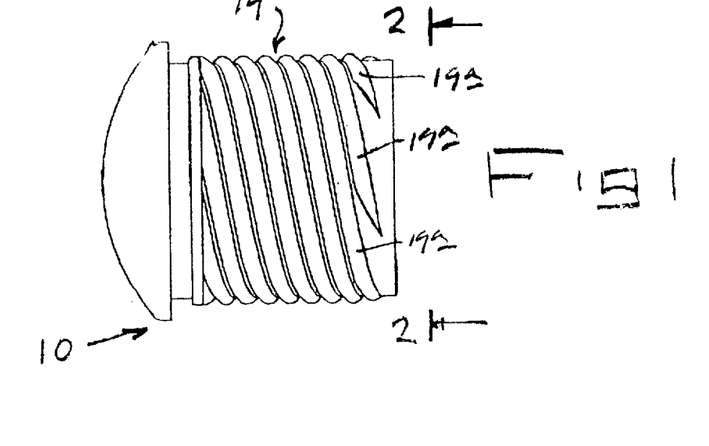
FIG. 1 is a side elevational view of the preferred form of threaded lens.
Figure 2:
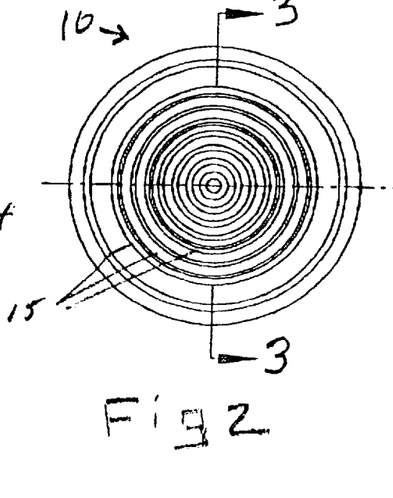
FIG. 2 is an end elevation taken on lines 2—2 of FIG. 1.
Figure 3:
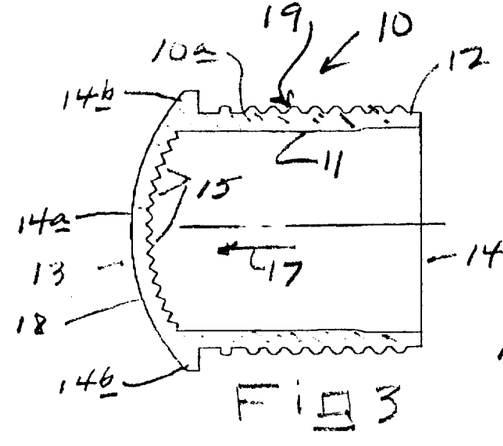
FIG. 3 is a lengthwise section taken on lines 3—3 of FIG. 2.
Figure 4:
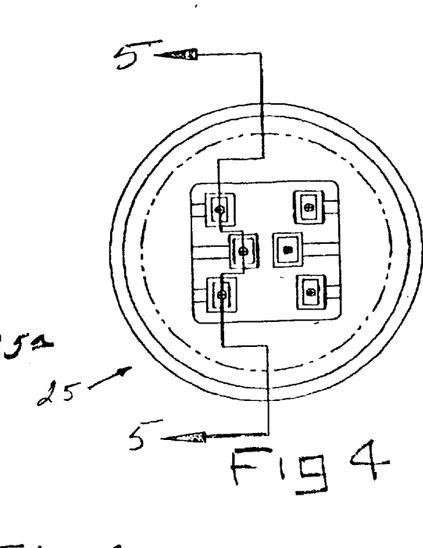
FIG. 4 is a right end elevation of a lens holder, defining a connector having six terminals.

Referring first to FIGS. 1–3, a lens 10 is adapted to be secured to a holder, to be described, for transmission of light, as for example from an LED or LED array. The lens 10 has a body 10a defining a central axis 11, and the body is shown as generally cylindrical defining an inner surface or bore 11, an outer surface 12, and opposite ends 13 and 14. End 14 is shown in the form of an integral cap having a dome 14a, and an outwardly projecting annular flange 14b. The inner side of the dome defines Fresnel rings 15, for diffracting light rays impinging in direction 17 on the rings, diffused light exiting from the convex outer side 18 of the dome. The body may consist of molded plastic material.

Threading indicated at 19 is formed on the lens body extending about said axis, for reception in threading associated with the holder. Such threading spirals about axis 11, while advancing in direction 17, as shown. Typically, multiple such threads 19a are employed, and are alike. The threads are foreshortened in length to allow for tightening into mating internal threading associated with the holder, to be described, in less than one full rotary turn of the lens 10, relative to the holder. Each thread 19a extends only part way about the axis 11 at the lens body periphery, and preferably six threads 19a are employed, each of which extends only about half way (180°) about axis 11.

Figure 5:
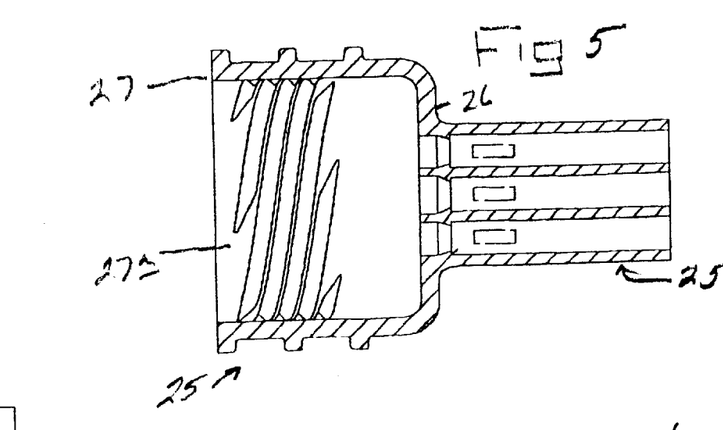
FIG. 5 is a section taken on lines 5—5 of FIG. 4.
Figure 6:
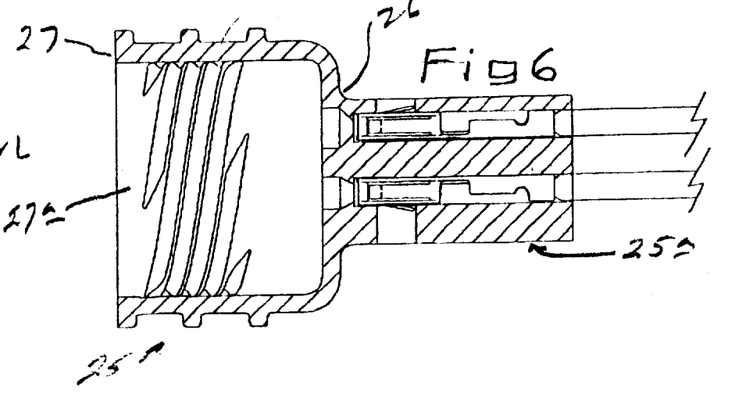
FIG. 6 is a view like FIG. 5, but rotated 90° about an axis defined by the holder.
Figure 7:
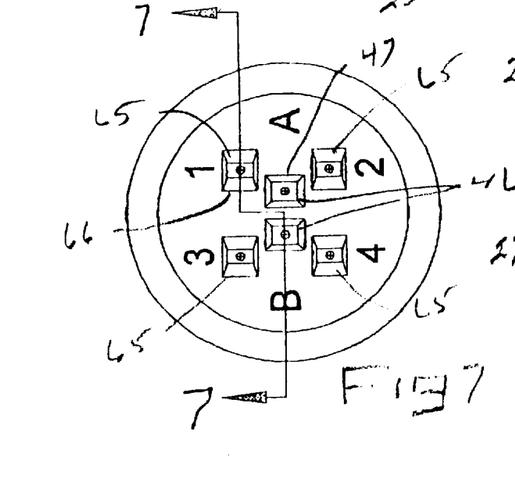
FIG. 7 is a left, end elevation of the holder taken on lines 7—7 of FIG. 6.
Figure 24:
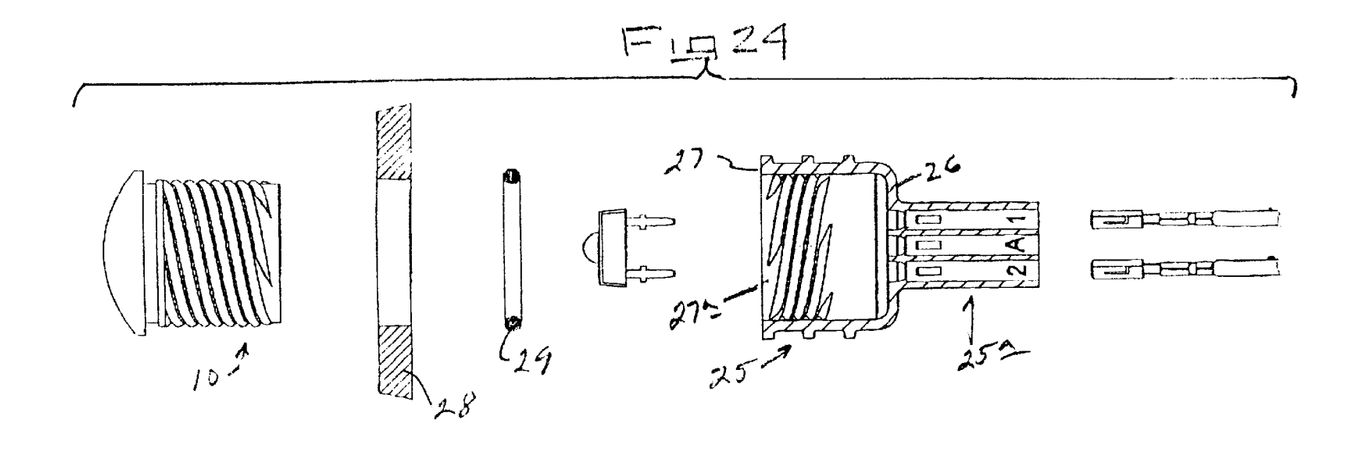
FIG. 24 is an exploded view of a threaded lens, threaded holder with connector terminals, pin terminals; LED plug having four terminals, and locking ring and in relation to a mounting panel.
Figure 25:
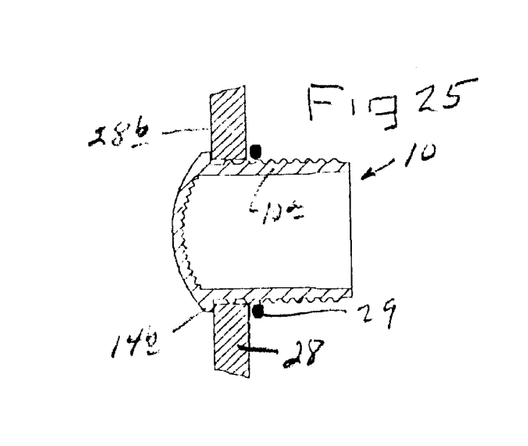
FIG. 25 is a section showing the assembled positioning of the lens, panel and locking ring of FIG. 24.

FIGS. 5, 6 and 24 show one form of lens holder 25, which is also integral with a reduced diameter connector 25a at one end 26 of the holder. The opposite end 27 of the holder is centrally open at 27a, for threaded reception of the lens body 10a, as the holder is rotated. At that time, the lens is typically retained by or mounted to a panel 28, as shown in FIG. 25, with a locking ring 29 mounted on the lens body and engaging wall 28a of the panel, and lens flange 14b engaging the opposite wall 28b of the panel.

Figure 8:
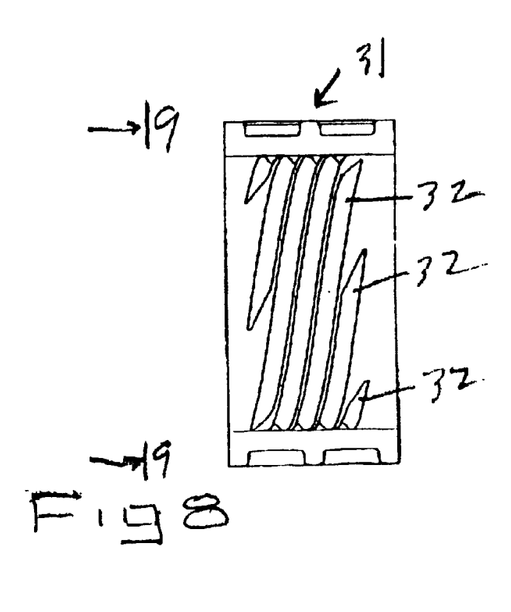
FIG. 8 is a section taken through an alternative lens holder in the form of an interiorly threaded retaining ring.
Figures 9, 10:
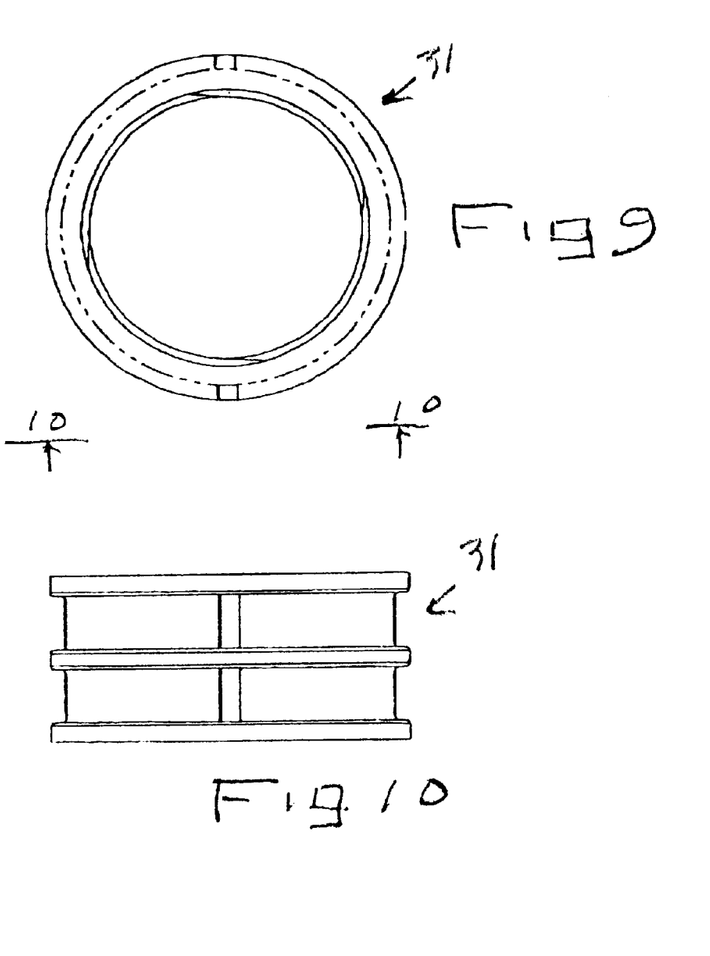
FIG. 9 is an end view of the FIG. 8 ring, taken on lines 9—9 of FIG. 8.
FIG. 10 is a side elevation taken on lines 10—10 of FIG. 9.

FIGS. 17–20 and 21–23 also show provision of a modified lens holder in the form of a retaining ring 31. That ring has internal threads at 32, the same as the internal threads 30 the holder 25. See also FIGS. 8–10.

Lens threads and connector mating threads 30 or retaining ring threads are formed to permit the mating parts to be pushed onto the lens and then with a half a turn, secure the two parts together. This feature prevents the wire leads protruding from the connector as at 85 from being twisted during installation. Additional turning of the connector during assembly would tend to cause excessive torque on the wires, which would cause an opposing twisting action on the connector.

The pitch of the threads allows for the connector or retaining ring and lens to be secured in only one full turn. The connector and retaining ring typically have six separate half threads, equally spaced wrap around the diameter. The lens mating six threads have two full turns which permits the units to be secured to varying panels from a $32^{nd}$ of an inch to $\frac{1}{4}^{th}$ inch thick.

The mating lens and connector or retaining ring are configured to be secured by hand tightening. If the connector or retaining ring are tightened past the secure point, then the threads will slip back onto a previous thread, as by over crest slippage seen in FIGS. 19 and 20. This feature prevents the plastic threads of the lens, connector or retaining ring from being stripped.

When a rubber grommet is used between the panel and the connector or retaining ring it functions as a locking unit. As the connector or retaining ring is tightened the grommet will compress. This compression causes back pressure on the threads of the mating parts providing a locking means.

When a rubber seal is installed between the lens and the panel it prevents the entry of water and dust through the panel opening.

FIGS. 17–20 show the thread interfitting sequence of the lens and holder elements, and the functioning of the compressible locking ring 29, which may consist of elastomeric material, such as rubber.

Figure 22:
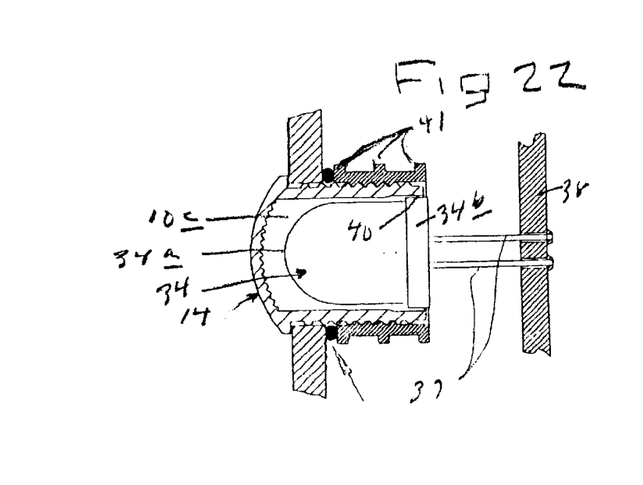
FIG. 22 is a view of the FIG. 21 components, in axially assembled relation.
Figure 23:
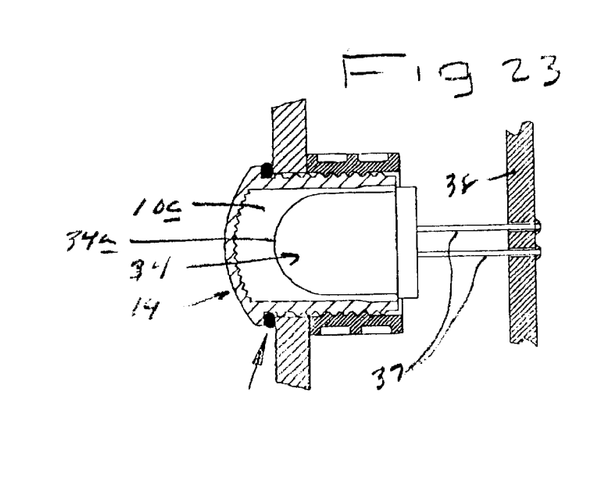
FIG. 23 is a view like FIG. 22, showing the locking ring and moisture seal component assembled in an alternate position.

Note in FIGS. 22 and 23 the reception of an LED plug type unit 34 into the interior 10c of the lens 10, with the dome 34a of unit 34 proximate the Fresnel rings at the concave interior side of the lens cap end 14. The leads 37 of the LED unit project from or through a circuit board 38 to which the leads are mounted, to support the unit 34. A flange 34b on unit 34 is closely received in the bore of the lens, at location 40, for centering. The lens has threaded attachment to the holder 31 as shown, and as described above. Holder ring 31 includes integral annular stiffeners 41 projecting outwardly. Ring 31 may consist of molded plastic material.

Figure 27:
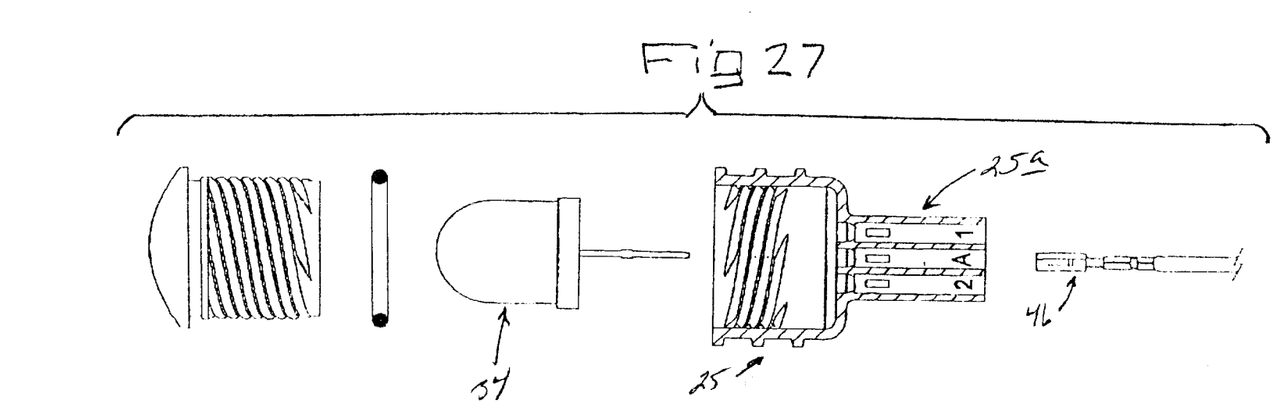
FIG. 27 is an axially exploded view of a threaded lens, threaded holder with connector terminals; pin terminals, the LED plug having two terminals; and locking ring, in relation to a mounting panel.
Figure 28:
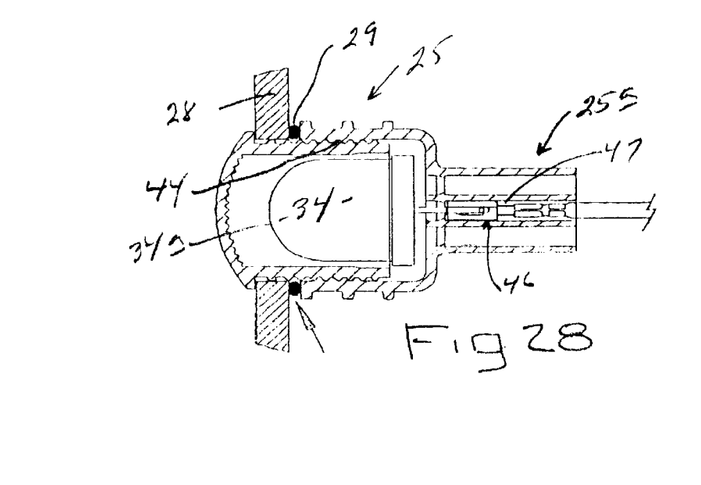
FIG. 28 is a section showing assembled positioning of the holder, locking ring, LED plug, connector receptacle terminals and supply power pin terminals, of the FIG. 27 components.
Figure 29:
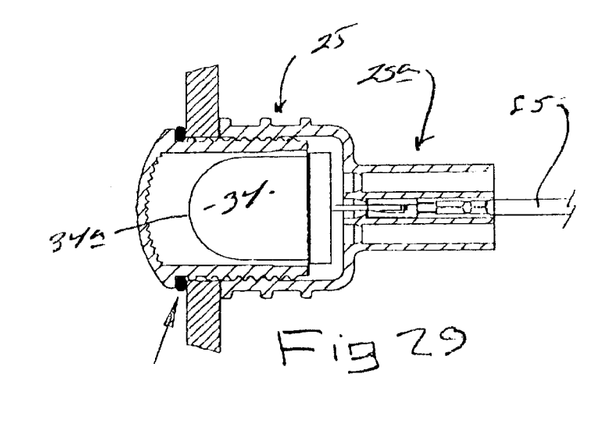
FIG. 29 is like FIG. 28, but showing the locking ring in position forward of the mounting panel.

FIGS. 27 and 28 show the plug type LED unit 34 assembled to a connector 25a as described above, the internal threads of holder 25 assembled to the lens threads at 44. The domed end 34a of unit 34 is received into the lens interior as described above; and locking ring 29 is held in compressed condition between the left end face of the holder and the panel 28. The two pins or leads 37 of the LED unit are received into two parallel female terminals 46 received into and carried by slots 47 in the connector 25a.

Figures 11, 12, 12A, 13, 14, 14A:
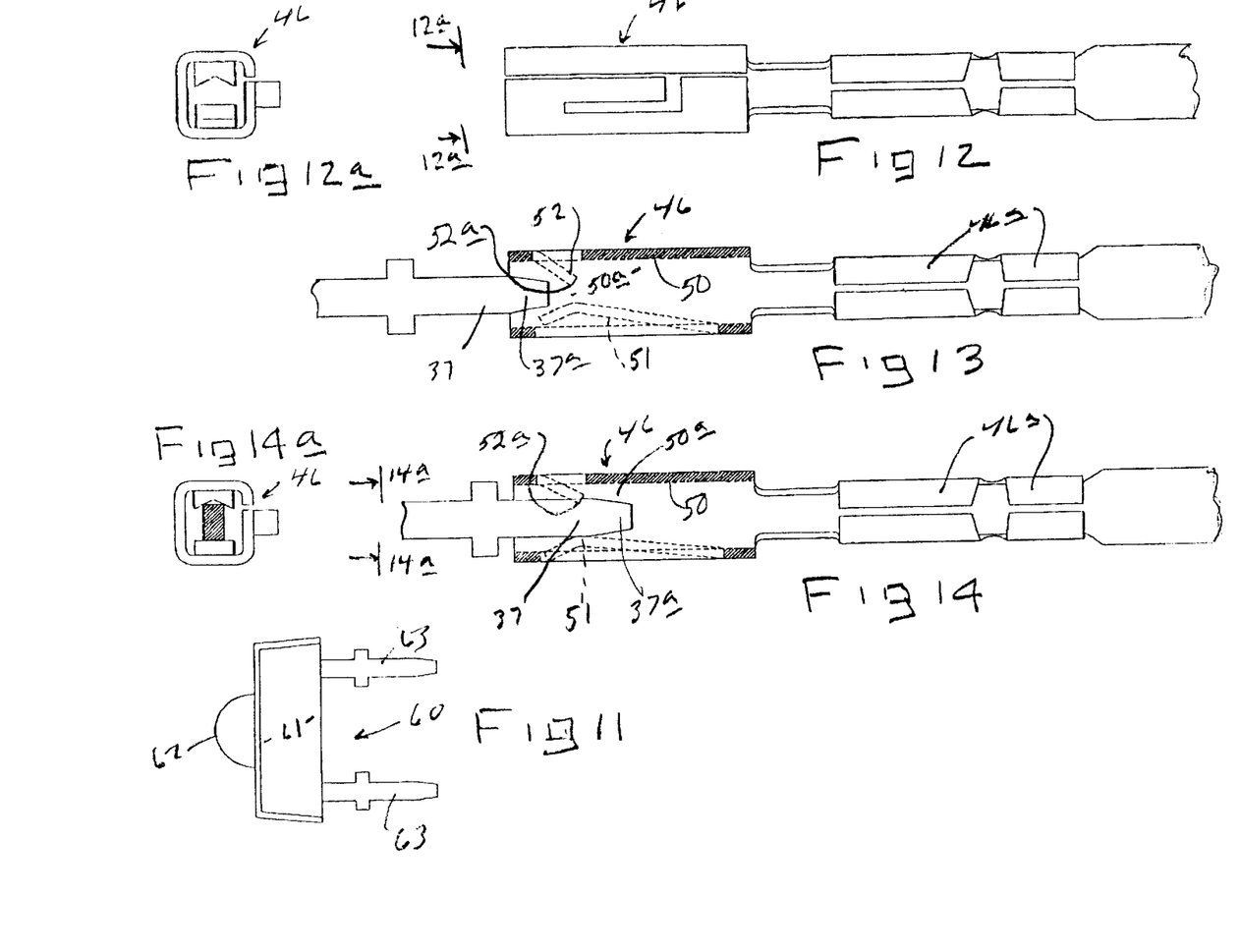
FIG. 11 is a side view of a terminal plug with four pins useful to plug into four receptacle terminals as seen in FIG. 4.
FIG. 12 is an enlarged view of a receptacle terminal.
FIG. 12a is an end view taken on lines 12a—12a of FIG. 12.
FIG. 13 is an enlarged view of a receptacle terminal receiving endwise reception of a terminal pin.
FIG. 14 is a view like FIG. 13 showing centering and interference connection of the pin to the terminal.
FIG. 14a is an end view taken on lines 14a—14a of FIG. 14.
Figure 15:
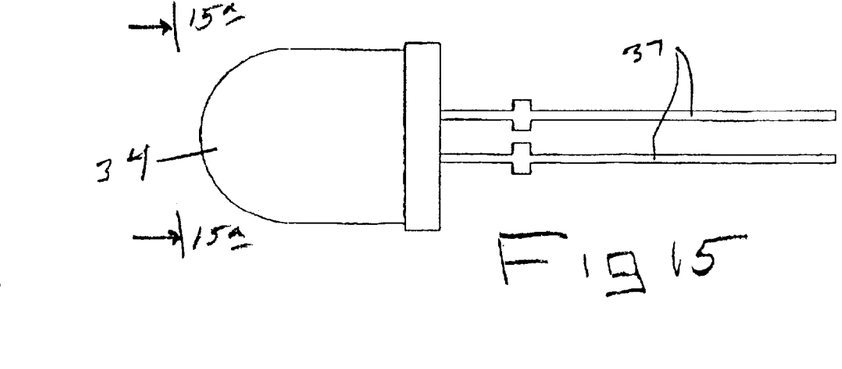
FIG. 15 is a side elevation showing a plug or LED unit carrying an LED or LEDs, and having two terminal pins.
Figure 15A:
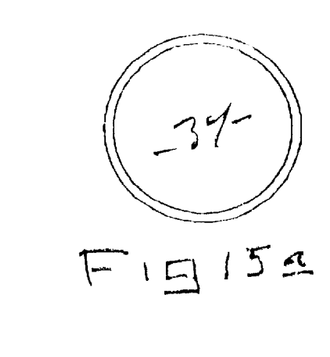
FIG. 15a is an end view taken on lines 15a—15a of FIG. 15.
Figure 16:
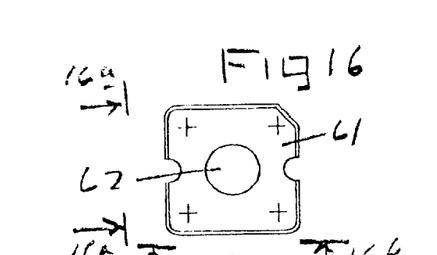
FIG. 16 is a top plan view showing another form of plug or LED unit carrying an LED or LEDs, and having four terminal pins.
Figure 16A:
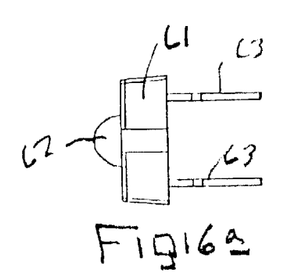
FIG. 16a is a side elevation taken on lines 16a—16a of FIG. 16.
Figure 16B:
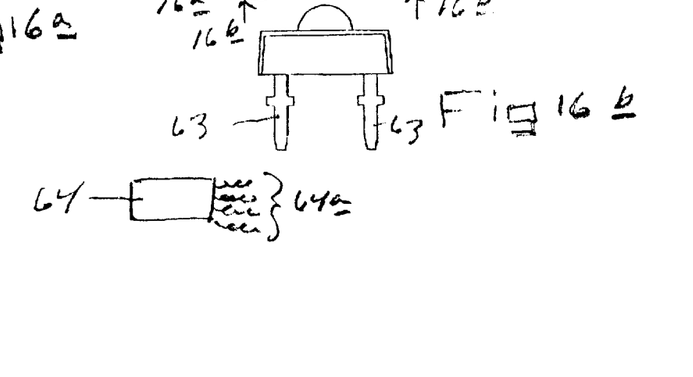
FIG. 16b is a side elevation taken on lines 16b—16b of FIG. 16.
Figure 17:
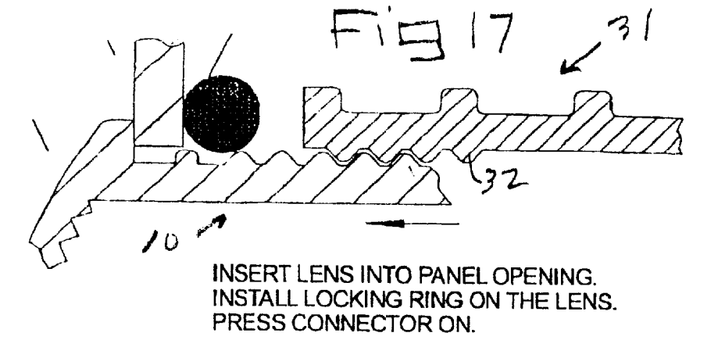
FIGS. 17–20 are enlarged fragmentary sections showing progressive connectors of an interiorly threaded retaining ring to an exteriorly threaded lens, in relation to a mounting panel.
Figure 18:
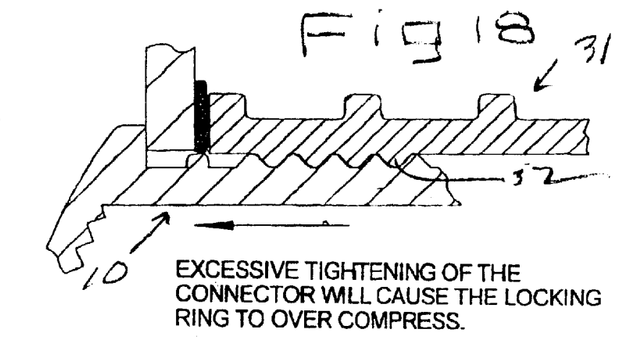
Figure 19:
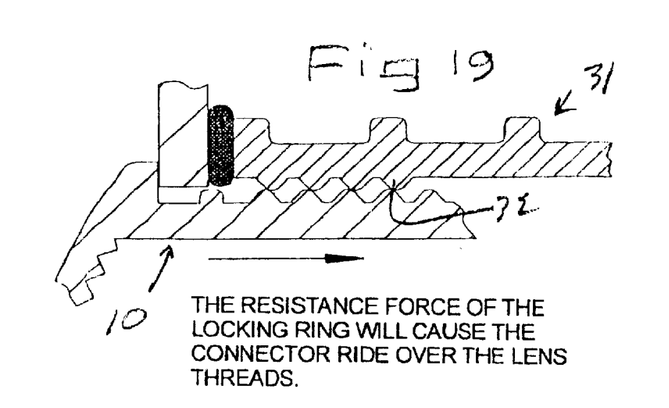
Figure 20:
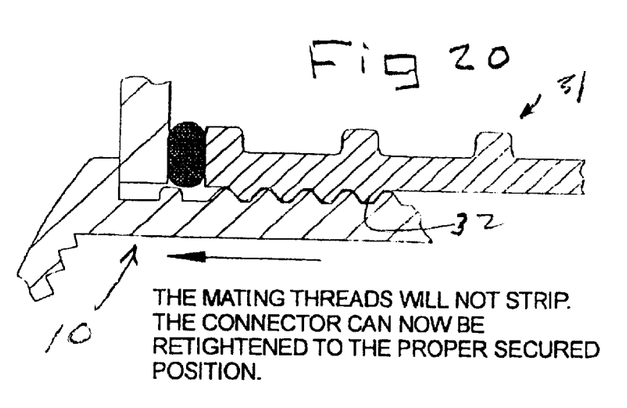

FIGS. 12–14 show progressive reception of a pin or lead 37 into a terminal 46. The tapered end 37a of the pin or lead penetrates into the tubular body 50 of the terminal, and between tapered guide 51 and internal barb 52. The guide and barb project laterally into the interior 50a of the body 50, with the guide slidably guiding the pin, and the barb 52 having an edge 52a riding along the side of the pin, with friction, to center the pin in the interior 50a. Edge 52a also gouges into the side of the pin to block endwise retraction or loosening of the pin from the terminal. Both 51 and 52 are resilient cantilever spring fingers. Wiring is retained to 46 at 46a.

Figure 26:
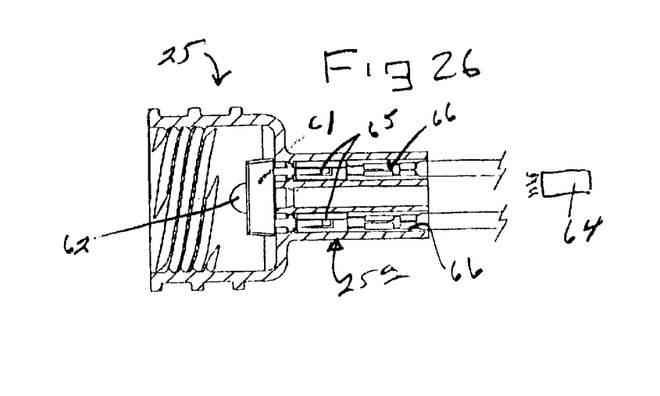
FIG. 26 is a section showing the assembled positioning of the holder, LED plug, connector receptacle terminals, and supply power pin terminals.

Another form of LED unit is seen at 60 in FIGS. 11, 16, 16a and 16b. Unit 60 has a polygonal body 61, a domed end 62 from which light is emitted, and four pins 63 located at corners of a square. Those pins or leads are adapted to receive controlled electrical energization as from a circuit 64, to control different colored light emission from three LEDs in the unit, the fourth pin being a common or ground. Color emission from unit 60 can thereby be controlled, by light color mixing within 60, for emission from domed end 62. FIGS. 24 and 26 show pins or leads 63 endwise received within, and electrically connected, to four female terminals 65. The latter are in turn received in four slots 66 in the connector 25a. A control circuit appears at 64, as in FIG. 16. See also FIGS. 5 and 6.

The connector 25a of FIGS. 4–7 is configured to receive the pins of either type LED unit, 34 or 60, i.e. it has four slots 66 at corners of a square, to receive the four terminals 65 of a unit 60. It also has two slots 47 to receive terminals 46 of a unit 43. Slots 47 are located within the square (see FIG. 7) defined by slots 66. A highly versatile and compact connector 25a is thereby provided.

The connector terminals also provide a method of extracting heat from the LED, which prevents over heating and extends the operating life of the device.

From the foregoing, it will be seen that the holder body 25 defines a less holder having a receptacle portion with internal threading to receive an externally threaded lens to transmit light of a controlled color emitted by the LED unit. The lens holder body may define a reduced size connector portion 25a, as at one end of the holder, and containing said first and second entry ports. The LED unit has a light emitting zone received in said holder receptacle portion, between said internal threading and said first and second entry ports in said connector portion.

Referring now to FIGS. 30–36, they show a modified form of the invention in which the holder body 75 defines first and second pairs of electrical terminal entry ports, and an additional pair of entry ports. See for example the first two entry ports 81 and 86; the second two entry ports 83 and 84; and the additional pair of entry ports 82 and 85.

Electrical sleeve terminals to be received in those ports appear at 81' and 86'; 83' and 84'; and 82' and 86'. Such terminals correspond to 46 in FIGS. 12–14. Ports 82 and 86 are located, i.e. interspersed or interposed relation section, ports 81 and 86, and ports 83 and 84. Ports 81, 82 and 83 define a primary plane 88; and ports 84, 85 and 86 define a secondary plane 89, parallel to 88.

Figures 30, 31, 32, 33, 34, 35, 36:
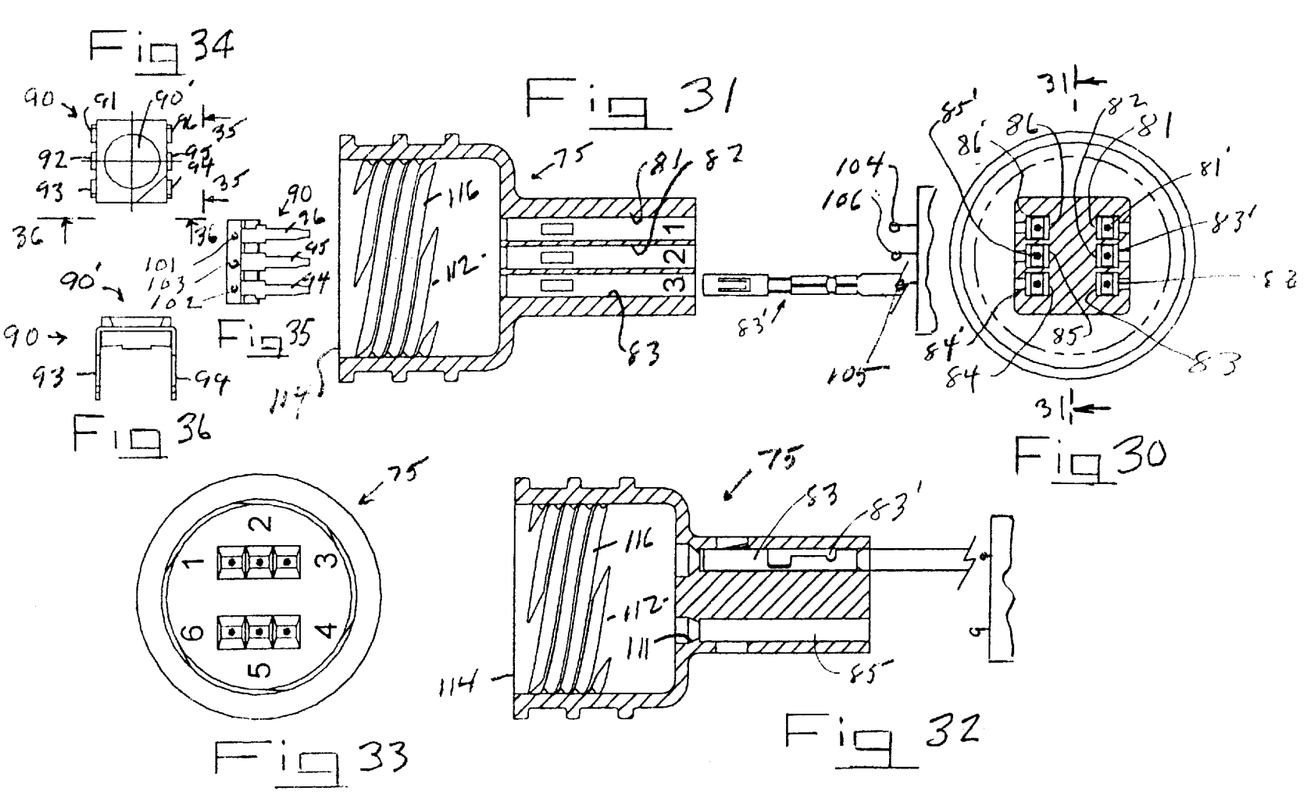
FIG. 30 is a view like FIG. 4, showing in right end elevation a modified lens holder, defining a connector having six terminals.
FIG. 31 is a section taken on lines 31—31 of FIG. 30.
FIG. 32 is a view like FIG. 31, but rotated 90° about an axis defined by the FIG. 30 holder.
FIG. 33 is a left end elevation of the FIG. 30 holder, taken on lines 33—33 of FIG. 32.
FIG. 34 is a top plan view of a plug carrying an LED or LEDs, and having six terminal pins, that plug to be inserted into the FIG. 30 holder.
FIG. 35 is a side elevation taken on lines 35—35 of FIG. 34.
FIG. 36 is a side elevation taken on lines 36—36 of FIG. 34.

A representative LED unit, with six pin terminals, is seen at 90. Pin terminals 91 and 96 are respectively receivable in sleeve terminals 81' and 86'; LED unit pin terminals 93 and 94 are respectively receivable in sleeve terminals 83' and 84'; and LED unit pin terminals 92 and 95 are respectively receivable in sleeve terminals 821 and 85'. Three LEDs in 90 appear schematically at 101, 102 and 103, where LED 101 is electrically connected between pin terminals 91 and 96; LED 102 is electrically connected between pin terminals 93 and 94; and LED 103 is electrically connected between pin terminals 92 and 95. Controllable circuitry 104 controls energization of LED 101; controllable circuitry 105 controls energization of LED 102; and controllable circuitry 106 controls energization of LED 103. Sockets 111 in 75 limit insertion of the Led pin terminals 91–96. The LED head 90' is then received in internal zone 112, in 75.

Figure 21:
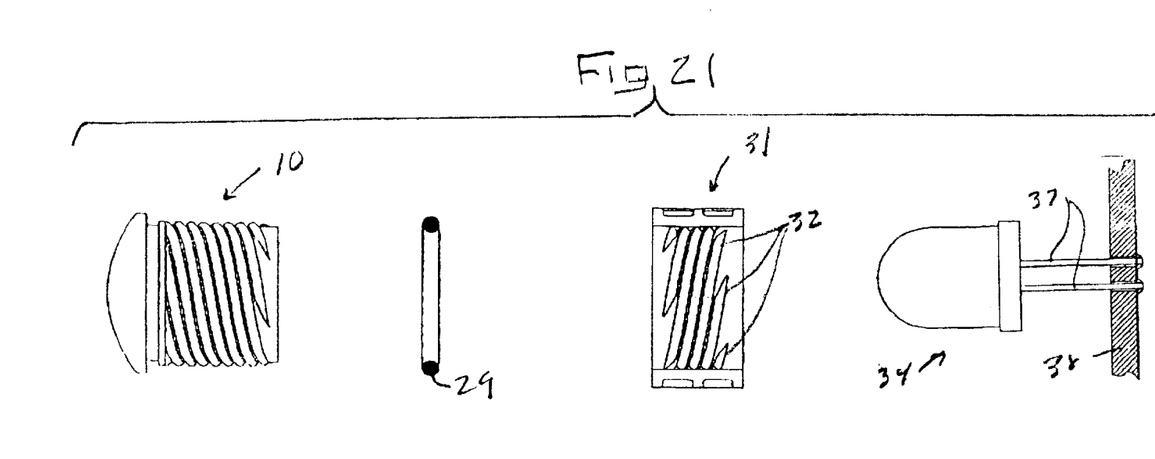
FIG. 21 is axially exploded view of a threaded lens, threaded retainer ring and a locking ring also serves as a moisture seal, this being a preferred application of the threaded lens.

It will also be noted that holder 75 is hollow and open at end 114; and internal threads 116 are provided to mesh with lens threading, of the type seen in prior figures, such as in FIGS. 1 and 21.

I claim:

1. An electrical connector comprising, in combination
    a) a body defining first and second electrical terminal entry ports,
    b) said first entry ports including four ports,
    c) there being an LED unit having pin terminals respectively received in three of said four ports, three of said pin terminals adapted for delivering controllable electrical current for controlling color emitted by the LED unit,
    d) another of said pin terminals received in a fourth one of said four ports,
    e) the connector body having internal threads, and there being a lens unit having external threads,
    f) said internal and external threads being plastic mating threads configured to forcibly and axially slip over crest as the connector is axially pushed relatively onto the lens unit, there being a compressible locking ring located in alignment with the connector to be compressively deformed as the connector body is pushed endwise toward the lens unit and as the threads slip over crest forwardly followed by rotary tightening of the connector threads in the lens unit threads, by less than about one full turn, the locking ring then expanding to a lesser compressed condition causing the external and internal threads to relatively slip over crest rearwardly, to a thread made up position of connector securement to the lens unit.

2. The combination of claim 1 wherein said second entry ports include two ports which are spaced closer together then any two of said four ports.

3. The combination of claim 2 wherein said two ports are within an a real zone defined by said four ports.

4. The combination of claim 1 including female electrical terminals in alignment with said first and second entry ports.

5. The combination of claim 4 wherein four of said female terminals associated with said first four entry ports receive LED unit four pin terminals.

6. The combination of claim 4 wherein two of said female terminals associated with said second entry ports receive LED unit two pin terminals.

7. The combination of claim 2 including female electrical terminals in alignment with said first and second entry ports.

8. The combination of claim 7 wherein four of said female terminals associated with said first four entry ports receive LED unit four pin terminals.

9. The combination of claim 7 wherein two of said female terminals associated with said second entry ports receive LED unit two pin terminals.

10. The combination of claim 4 wherein each female terminals includes a sleeve, a tapered guide surface within said sleeve, and a spring finger having an edge to frictionally engage the surface of an LED unit terminal pin received in the sleeve.

11. The combination of claim 8 wherein each female terminal includes a sleeve, a tapered guide surface within said sleeve, and a spring finger having an edge to frictionally engage the surface of an LED unit terminal pin received in the sleeve.

12. The combination of claim 1 wherein said first and second entry ports are interspersed.

13. The method of using the combination of claim 3 which includes
   a) selecting one of two LED units, the first characterized as having four pin terminals, and the second characterized as having two pin terminals,
   b) and inserting the pin terminals of the selected LED unit into one of said connector first entry ports and second entry ports spaced apart and interspersed to receive said pin terminals.

14. The method of claim 13 including providing selected female terminals in alignment with said entry ports to receive insertion of said selected pin terminals.

15. The method of claim 14 including providing a hollow lens in alignment with said LED unit, and to internally receive the LED unit.

16. The method of claim 15 wherein said step b) locates said selected LED within said connector, and said lens is threadably connected into the connector to receive at least a part of the LED unit.

17. The combination of claim 1 wherein said LED unit has additional pin terminals received in said second electrical terminal entry ports.

18. The combination of claim 17 wherein said second electrical terminal entry ports include two ports, whereby said LED unit has two of said additional pin terminals.

19. The combination of claim 18 wherein said LED unit has a total of six pin terminals including
   i) first and second pairs of terminals received in said first entry ports,
   ii) and a third pair of pin terminals defined by said additional pin terminals, received in said second entry port.

20. The combination of claim 19 including circuitry connected with said first, second and third pairs of terminals to control color emitted by said LED unit.

21. The combination of claim 20 wherein said LED unit includes a first LED electrically connected to said first pair of terminals (1 and 6); a second LED electrically connected to said second pair of terminals (3 and 4); and a third LED electrically connected to said third pair of terminals.

22. The combination of claim 20 wherein said third pair of terminals is located between said first and second pairs of terminals.

23. The combination of claim 1 wherein said body defines a lens holder having a receptacle portion with internal threading to receive an externally threaded lens to transmit light of a controlled color emitted by the LED unit.

24. The combination of claim 23 wherein said body defines a reduced size connector portion containing said first and second entry ports.

25. The combination of claim 24 wherein said LED unit has a light emitting zone received in said holder receptacle portion, between said internal threading and said first and second entry ports in said connector portion.

26. In combination
   a) a holder in the form of a socket at one end of the holder and a connector at the opposite end of the holder,
   b) internal threads in the holder to threadably connect to a lens unit,
   c) the connector having terminal ports,
   d) and an LED unit having a light transmitting end received into the holder, said unit having pins received into said connector ports, for electrical connection to circuitry that energizes one or more LEDs in said unit,
   e) and including said lens unit having external threads, said external and internal threads being plastic mating threads configured to forcibly and axially slip over crest as the connector is axially pushed relatively onto the lens unit, a compressible locking ring being provided and located in alignment with the connector to be compressively deformed as the connector is pushed endwise toward the lens unit and as the threads slip over crest forwardly followed by rotary tightening of the connector threads, on the lens unit threads, by less than about one full turn, the locking ring then expanding to a lesser compressed condition causing the external and internal threads to relatively slip over crest rearwardly, to a thread made up position of connector securement to the lens unit.

27. The combination of claim 26 wherein there are six of said ports.

28. The combination of claim 27 wherein three of said ports are in one row, to define a plane, another three of said ports are in another row to define a second plane, said planes being parallel.

29. The combination of claim 27 wherein three of said ports define a first staggered row, and another three of said ports define a second staggered row.

* * * * *